US009126825B2

(12) United States Patent
Molin et al.

(10) Patent No.: US 9,126,825 B2
(45) Date of Patent: Sep. 8, 2015

(54) IMPLANTABLE BIOCOMPATIBLE COMPONENT INTEGRATING AN ACTIVE SENSOR FOR MEASUREMENT OF A PHYSIOLOGICAL PARAMETER, A MICRO-ELECTROMECHANICAL SYSTEM OR AN INTEGRATED CIRCUIT

(75) Inventors: Renzo Dal Molin, Chatillon (FR); Alain Ripart, Gif-sur-Yvette (FR)

(73) Assignee: SORIN CRM SAS, Clamart (FR)

( * ) Notice: Subject to any disclaimer, the term of this patent is extended or adjusted under 35 U.S.C. 154(b) by 1392 days.

(21) Appl. No.: 11/860,250

(22) Filed: Sep. 24, 2007

(65) Prior Publication Data

US 2008/0102096 A1    May 1, 2008

(30) Foreign Application Priority Data

Sep. 25, 2006  (FR) ...................................... 06 08369

(51) Int. Cl.
*B81B 7/00* (2006.01)
(52) U.S. Cl.
CPC ............. *B81B 7/007* (2013.01); *B81B 2201/06* (2013.01)
(58) Field of Classification Search
CPC ................................ B81B 7/007; A61N 1/375
USPC .......................................................... 607/36
See application file for complete search history.

(56) References Cited

U.S. PATENT DOCUMENTS

| | | | |
|---|---|---|---|
| 4,023,562 A | | 5/1977 | Hynecek et al. |
| 5,304,208 A | * | 4/1994 | Inguaggiato et al. ........... 607/17 |
| 6,118,181 A | | 9/2000 | Merchant et al. |
| 6,312,393 B1 | * | 11/2001 | Abreu ........................... 600/558 |
| 6,330,464 B1 | * | 12/2001 | Colvin et al. .................. 600/316 |
| 6,711,423 B2 | * | 3/2004 | Colvin, Jr. ..................... 600/317 |
| 6,968,743 B2 | | 11/2005 | Rich et al. |
| 6,979,597 B2 | | 12/2005 | Geefay et al. |
| 7,034,677 B2 | * | 4/2006 | Steinthal et al. ......... 340/539.12 |
| 7,403,805 B2 | * | 7/2008 | Abreu ........................... 600/318 |
| 2002/0072784 A1 | * | 6/2002 | Sheppard et al. ............... 607/60 |
| 2003/0209357 A1 | | 11/2003 | Margomenos et al. |
| 2004/0259325 A1 | * | 12/2004 | Gan ............................... 438/456 |
| 2006/0161216 A1 | * | 7/2006 | John et al. ....................... 607/40 |
| 2006/0174712 A1 | | 8/2006 | O'Brien et al. |
| 2006/0192272 A1 | | 8/2006 | Receveur et al. |
| 2006/0265026 A1 | * | 11/2006 | Madjar et al. ................... 607/51 |
| 2007/0244520 A1 | * | 10/2007 | Ferren et al. ..................... 607/2 |
| 2008/0021339 A1 | * | 1/2008 | Gabriel et al. ................ 600/532 |

FOREIGN PATENT DOCUMENTS

WO    WO 2004/035461    4/2004

* cited by examiner

*Primary Examiner* — Christopher D Koharski
*Assistant Examiner* — Michael D Abreu
(74) *Attorney, Agent, or Firm* — Foley & Lardner LLP

(57) ABSTRACT

An implantable biocompatible component (10) integrating an active element of the type of a sensor for the measurement of a physiologic parameter, a micro-electromechanical system and an integrated electronic circuit. This component (10) has a substrate (12) and a lid (22) in silicon or quartz. The substrate (12) integrates the active element (14) and biocompatible metallic pads (16), electrically connected to the active element. The lid (22) encompasses and peripherally closes the substrate in a hermetic manner, level with the face integrating the active element. This component is void of metallic case for insulation between the active element and outside environment, and of insulative feedthrough for electrical connection to the active element. The substrate and lid can be directly welded to each other through their faces in vis-à-vis, or by interpositioning a sealing ring made of a biocompatible material.

22 Claims, 3 Drawing Sheets

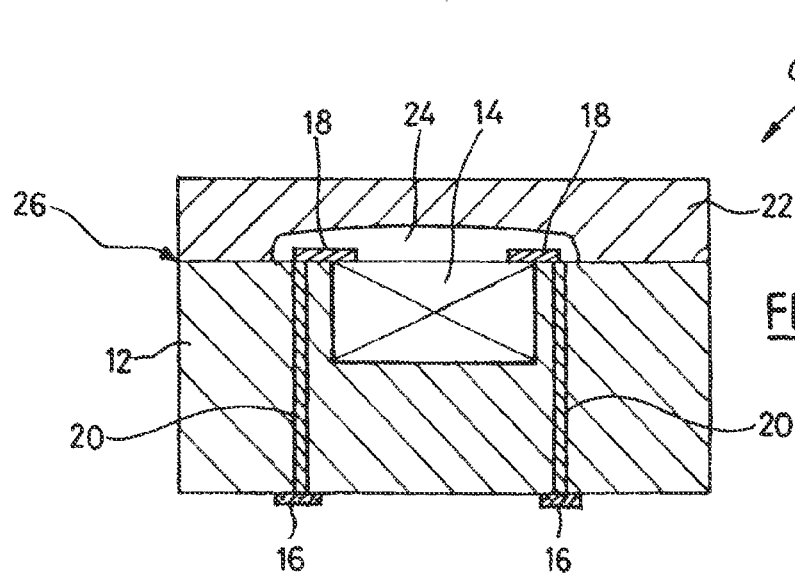
FIG_1
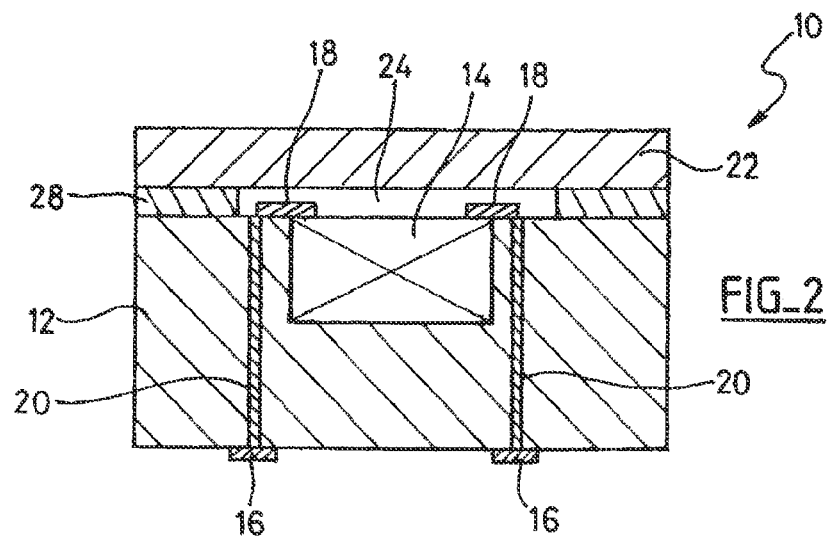
FIG_2
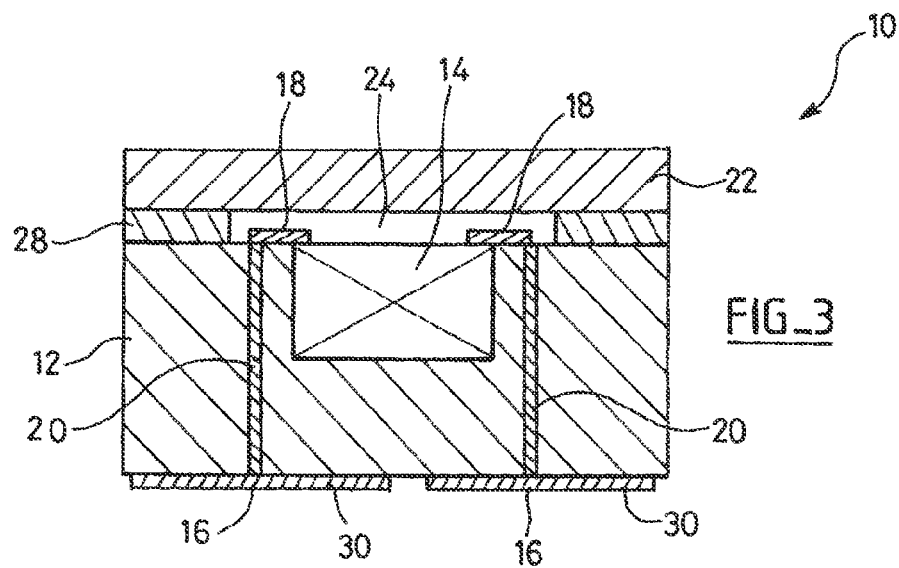
FIG_3

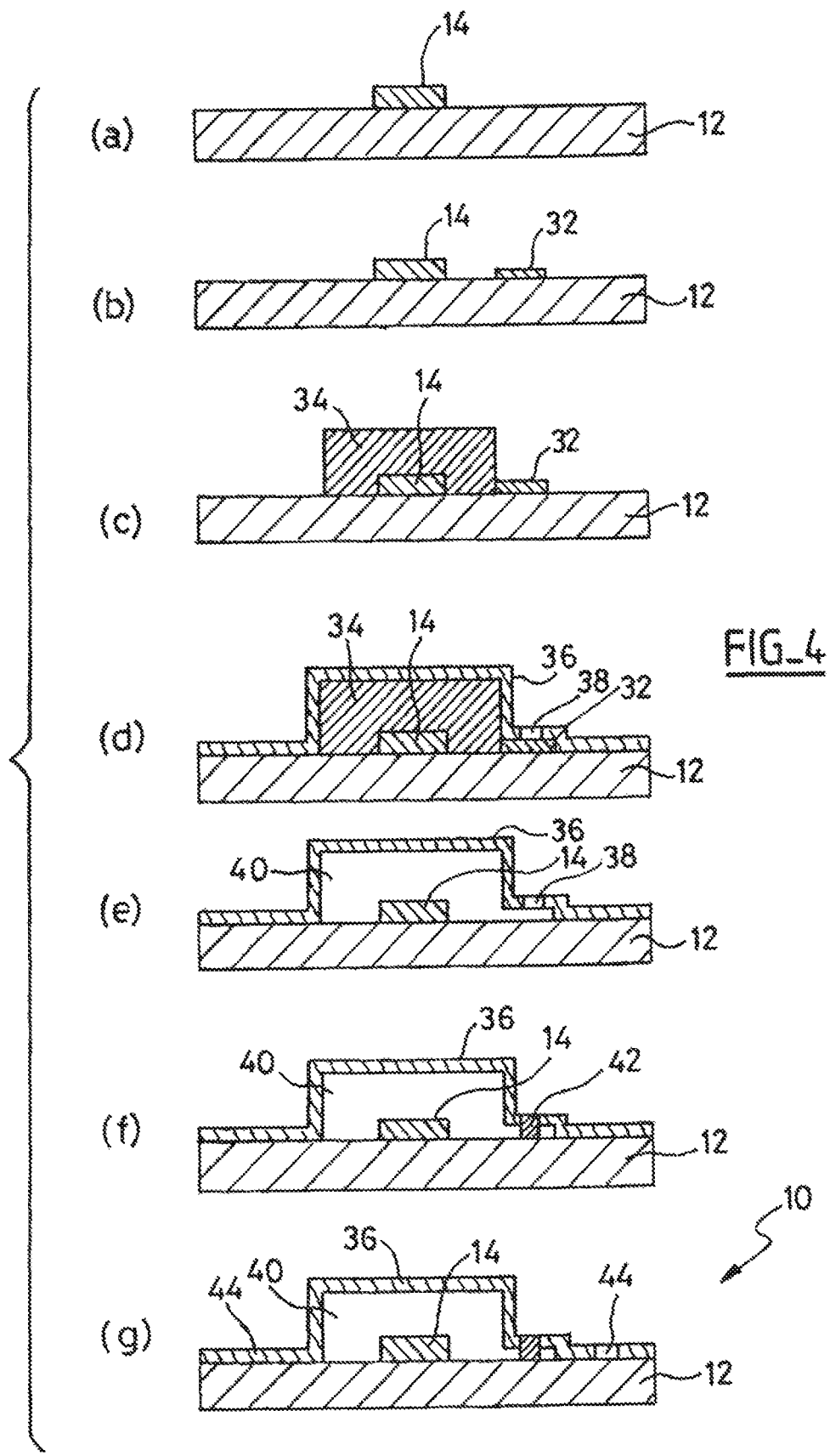
FIG_4

FIG_5
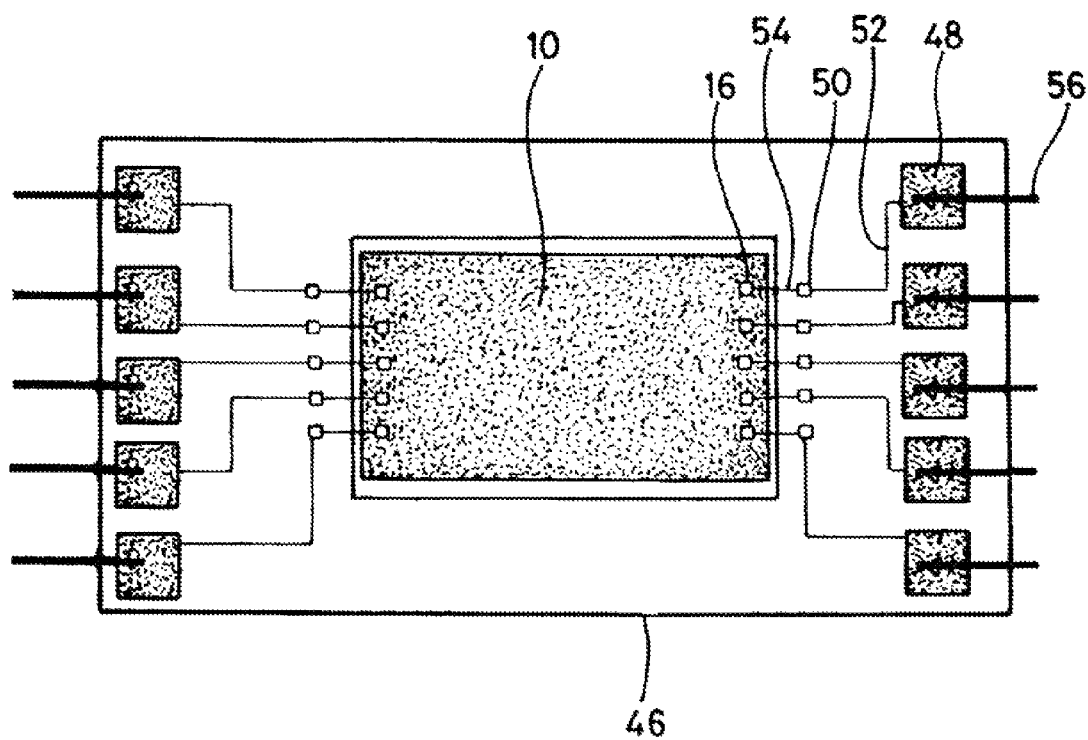

IMPLANTABLE BIOCOMPATIBLE COMPONENT INTEGRATING AN ACTIVE SENSOR FOR MEASUREMENT OF A PHYSIOLOGICAL PARAMETER, A MICRO-ELECTROMECHANICAL SYSTEM OR AN INTEGRATED CIRCUIT

FIELD OF THE INVENTION

The present invention relates to "active medical devices" as such devices are defined by the Jun. 14, 1993 Directive 93/42/CE of the Council of the European Community, and more particularly to "active implantable medical devices" as defined by the Jun. 20, 1990 Directive 90/385/CEE.

This definition more particularly includes those devices intended to monitor cardiac activity and schedule and deliver pulses for pacing, resynchronization, defibrillation and/or cardioversion of the heart in the case of a rhythm disorder detected by the device. It also includes neurological devices, medical drug diffusion pumps, cochlear implants, implanted biological sensors, etc., as well as pH measurement devices or intracorporal impedance measurement devices (such as transpulmonary impedance or intracardiac impedance).

BACKGROUND OF THE INVENTION

Active implantable medical devices utilize sensors for collecting the signals and controlling various functions. Some sensors can notably be integrated with a lead, which is itself connected to the case of a pulse generator. Typical examples of such sensors are blood pressure sensors or endocardial acceleration (EA) sensors mounted level with the distal tip of an endocardial lead that is introduced in the myocardium, and connected to the case of a pacemaker of defibrillator.

The present invention more particularly relates to a biocompatible component that is implantable in the human body, and embedding an active element that is hermetically encapsulated. The active element may be a sensor for the measurement of a physiologic parameter, a microelectromechanical system, or an integrated electronic circuit.

As used herein, "active element" will hereinafter be referred to as "sensor", but it should be understood that this invention shall not be interpreted in a limitative manner, and one of ordinary sill in the art will easily understand that it covers not only sensors as such, i.e., signal transducers that produce an electrical or optical signal that is function of the variations of a physical parameter, but also active electronic circuits such as amplifiers, filters, etc., whether or not associated to a sensor, in the vicinity thereof, or micro-electromechanical systems (MEMS), and more generally any element technologically integrable onto a substrate in a material such as silicon or any semiconductor material, consistent with the definition of active element.

Implanted sensors are subjected to very strict requirements, particularly when they are in direct contact with blood or other body fluids, and especially when said contact is very long or permanent, i.e., over a duration of several years in the case of cardiac implants.

These requirements are preferably as specified in the ISO 10993 series of international standards, and are of two kinds:
biocompatibility of the materials in use, that is to say that, on the one hand, these materials shall remain totally inert towards surrounding body tissues and fluids (harmless), and, on the other hand, these tissues or fluids shall not induce any corrosion or degradation of the material properties, which shall remain intact notwithstanding the prolonged contact with surrounding biological medium.

Hermeticity, that is to say that the sensor shall withstand not only the fluid ingress (tightness), but also ingress of gasses, which requires a perfectly controlled and minimized leak rate.

Heretofore, it has been considered sufficient to enclose or coat the sensor in a biocompatible material. More recent standards, however, now require a dual level of protection, with not only a biocompatible coating, but also biocompatibility of the coated element. The purpose is to ensure proper protection in the case of indirect contact, for example, due to the diffusion through the coating, between the sensor and surrounding medium, or in the case of degradation, cracking, etc., of the coating after a prolonged period of time.

In order to comply with these very strict requirements, it is known to embed the sensor in an inert metal case, usually made of titanium. Ceramic feedthroughs welded on the case allow to establish electrical connections between the sensor enclosed inside the case and the outside, in order to establish the connection to the internal lead conductors.

This solution complies with the biocompatibility and hermeticity requirements noted above. However, such a solution is expensive, due to the technology that is not easy to implement, components that are costly and difficult to assemble, and the difficulty to implement for an automatic manufacturing process, and a fortiori collective processing, which would allow mass production. Moreover, this known technique leads to components having a relatively large volume because the case cannot be miniaturized as much as desired.

Also, there is an existing and increasing need for small sized sensors to be notably placed on very small diameter leads, which are compatible with common practice in terms of implantation through a venous network catheterization.

OBJECTS AND SUMMARY OF THE INVENTION

It is therefore an object of the present invention to propose a component including a sensor (or any other active element) that does not require a titanium case and feedthrough for the electrical connection, though providing a biocompatibility and hermeticity in compliance with very strict requirements resulting from the implantable character of this component, and the necessity to withstand a prolonged contact with body tissues and fluids such as blood.

It is a further object to provide an acceptable biocompatibility and hermeticcity performance over a very long duration, typically several years, as with the case of cardiac implantable devices.

It is yet another object of the present invention to reduce the manufacturing cost of such as implantable biocompatible component, though the implementation of reliable technologies, also offering the possibility for a manufacturing through collective processing.

It is yet another object of the present invention to propose such an implantable biocompatible component presenting an advanced miniaturization, preferably allowing the placement of one or more such components on very small diameter leads.

One embodiment of the present invention is to propose an implantable biocompatible component having a configuration that allows a remote power feed and data exchange through non-galvanic methods, typically through an RF link, without excessive increase of the technologic complexity.

U.S. Pat. No. 4,023,562 describes a pressure sensor that is integrated in a substrate, encapsulated below a lid providing a package whose biocompatibility allows for instance the introduction into a catheter during an intervention, in order to measure pressure at a given location within a human body. However, the configuration described in this document is not suitable to the purposes cited above: notably, it does not provide a biocompatibility and hermeticity over a sufficiently long duration, and does not allow collective (mass) manufacturing. Indeed, in this document, contact with the sensor terminals is made through metal pads located on the side of the lid, in the same plane as the component and the electrical connection is ensured by a horizontal trench, also formed in the same plane, with a boron diffusion so as to render it conductive. This technique does not allow to obtain low-resistance contacts, for the resistivity of a boron diffusion is notably higher than that of a metal. Besides, this proposed technique does not allow a collective processing of a same silicon wafer, provided it is impossible to simultaneously saw the base substrate and the lid, due to the lateral contacts.

In addition, the silicon of the substrate and lid is doped with phosphorus, which does not provide for a long-term biocompatibility, and renders this component usable for only interventions of a relatively short duration (several hours, or at the longest several days).

U.S. patent application 2003/0209357 describes a technique for placing the component on a substrate, and then encapsulating the whole with a silicon lid. Here, the contact is made through the opposite side of the substrate, on which the MEMS component is supported. To that end, the substrate is deeply hollowed by KOH etching, from one side to the opposite, down to a metallization present on the opposite side; the electrical connection is obtained through covering the whole of the holes obtained with a metallization.

Notably due to these through-holes of a large dimension, the component thus obtained is not likely to provide the required hermeticity for a body implant (that is not actually the application discussed by this document).

Further, the necessity to support a component on the substrate, in addition to increasing the size and volume, does not allow a collective processing likely to substantially lower the manufacturing cost.

The present invention therefore proposes a biocompatible component that is implantable in the human body, incorporating, hermetically encapsulated, an active element of the type of a sensor for the measurement of a physiologic parameter, micro-electromechanical system or integrated circuit. The component comprises: a base substrate made of silicon or quartz integrating on one of its faces said active element, and equipped with biocompatible metal pads, formed on a free surface of that same substrate, said pads being electrically connected to the active element through electrical connections integrated on the substrate, and a lid made of silicon or quartz, covering and peripherally closing the substrate in a hermetic way, on the side of the face that is integrating the active element. Advantageously, this component is essentially void of metallic case for insulation between the active element and outside surroundings, and void of insulative feedthroughs for electrical connection to the active element.

The substrate and the lid can be directly sealed one to the other through their faces in opposition, or by interpositioning a biocompatible sealing material such as a sealing ring made of a biocompatible material. In the latter case, the sealing ring material can either be a biocompatible glass, metal or metal alloy, preferably gold or palladium.

The metal pads are preferably coated with gold and, when the active element comprises radiofrequency (RF) transmissions and/or a remote power feed, the dimensions and respective configuration of at least one of said pads are chosen so as to form a suitable antenna.

In a preferred embodiment of the present invention, the lid is made through a technique of the Thin Film Packaging type (TFP).

The material for the substrate and lid is preferably a boron-doped silicon.

BRIEF DESCRIPTION OF THE DRAWINGS

Further features, advantages and characteristics of the present invention will become apparent to a person of ordinary skill in the art in view of the following detailed description of preferred embodiments of the invention, made with reference to the drawings annexed, in which like reference characters refer to like elements, and in which:

FIG. 1 is a schematic section view of a component according to the present invention, where the substrate and lid are directly sealed one to the other;

FIG. 2 is a variant of FIG. 1, where the substrate and lid are welded by interpositioning a sealing ring;

FIG. 3 is a variant of FIG. 2, adapted to a component integrating an RF feature;

FIG. 4 shows a sequence of steps according to a "Thin Film Packaging" (TFP) process for realizing a component in accordance with the present invention; and FIG. 5 is a plane view of a component according to the invention, mounted on a support with appropriate connections.

DETAILED DESCRIPTION OF THE INVENTION

With reference to FIGS. 1-5, one will now describe a preferred embodiment for the realization of a component in accordance with the present invention. In the drawings, reference 10 represents in a general manner, the component of the present invention, which comprises a substrate 12, preferably made of silicon, another semiconductor material or quartz, integrating an active element, such as a sensor 14. This sensor can, for example, be a blood pressure sensor (of the SAW or BAW type) or an accelerometer (piezoelectric or based upon MEMS), particularly intended to measure endocardial acceleration (EA) at the tip of a lead implanted in the apex of the ventricle.

Preferably, substrate 12 has a thickness that can be reduced by running-in down to a very low value, approximately 200 µm, providing a component of very thin thickness that is easy to include in implanted leads of very small dimensions.

The electrical connection with sensor 14 is ensured by conducting pads 16 appearing on the outside of the component, and covered with a coating ensuring biocompatibility, for example, gold. Connecting pads 16 can be, as shown in the figures, located on a face of substrate 12 opposite to the face on which the sensor 14 is integrated. In such case, the connection to the conductor 18 in contact with sensor 14 is ensured through vias 20, for example, filled through plasma engraving through substrate 12, then filled through with an electrolytic deposit of copper or any other appropriate metal; such a technique is for instance described in published U.S. patent application 2004/0259325 and incorporated by reference and to which one can refer to for further detail.

The substrate 12 is closed, on the side where sensor 14 is located, by a lid 22, preferably made of silicon or quartz which, as in the example of FIG. 1, comprises a recess in its internal side, facing sensor 14.

In the embodiment illustrated in FIG. 1, the substrate 12 and lid 22 are directly sealed to each other through their faces vis-à-vis, at the interface 26. Such a direct silicon-silicon sealing technique is for example described in U.S. Pat. No. 6,979,597 incorporated herein by reference and to which one can refer to for further details thereon.

This technique for realizing the contacts presents a few major advantages. First, it makes contacts with a very low resistance, thanks to the filling with a metal. Second, this metal filling ensures an excellent hermeticity between the internal volume and the cavity 24 that contains the sensor 14, and the opposite side, containing the contact pads 16. Third, this configuration is biocompatible, while allowing a collective processing, the substrate 12 and lid 22 being possibly sawn together so as to individualized the component 10.

In the embodiment illustrated in FIG. 2, the substrate 12 and lid 22 are not directly sealed to each other, but instead are sealed through an intermediate biocompatible sealing material, for example, sealing ring 28 made of biocompatible metal or metal alloy, preferably based upon gold or palladium. Such a technology is, for example, described in U.S. Pat. No. 6,118,181 incorporated herein by reference and to which one can refer to for further details. The material of sealing ring 28 can alternatively be an appropriate glass having a low rate of impurities.

When silicon is used as the material for substrate 12 and lid 22, such silicon is preferably doped with boron, such doping having the property to improve its biocompatibility, as notably described in U.S. Pat. No. 6,968,743.

In the embodiment illustrated in FIG. 3, pads 16 forming contact electrodes are prolonged and configured with an appropriate pattern 30 so as to form an antenna (dipole, loop, etc.), allowing to ensure a non-galvanic connection with sensor 14. The latter can then be remotely fed power and incorporated with a totally autonomous active component, void of any direct wire connection. In an embodiment in which the component implements an RF communication function it can preferably constitute an implantable radiofrequency identification device (RFID), operating in frequency ranges such as the MICS band (Medical Implants Communication System) of 402-405 MHz or standard public ISM bands (Industrial, Scientific and Medical) of 863-870 MHz, 902-928 MHz and 2.4 GHz used by medical devices, allowing remote interrogation of the active element 14 through RF telemetry.

With reference to FIG. 4, different steps of a process of the "Thin Film Packaging" (TFP) type, applied to the making of a component in accordance with the present invention is shown. The sensor 14 is then protected by a thin film lid formed directly on the substrate through steps of deposition and etching (engraving), instead of a supported sealed lid, as in the embodiments illustrated in FIGS. 1-3.

The first step in the TFP process (Step a) provides placing sensor 14 on the substrate 12.

Then (step b), a first sacrificial layer 32, of a small thickness, is locally deposited on the substrate at a distance from, but in the proximity to sensor 14. One other sacrificial layer 34, of a large thickness, is then deposited on the substrate (step c), and encompasses sensor 14, up to the location of the first sacrificial layer 32.

The following step (step d) deposits a film or thin layer 36 for closure, which will then constitute the lid of the component in the ensemble thus built up. An opening 38 is realized in layer 36, facing sacrificial layer 32. For the making of the thin lid 36, miscellaneous appropriate materials can be used, which ensure a hermeticity up to the expected level, for example, deposition of a nitride film through PECVD (Plasma Enhanced Chemical Vapor Deposition) technique.

The following step (step e) eliminates the two sacrificial layers 32 and 34 by etching through opening 38. This forms around sensor 14, a free internal volume 40, closed by layer 36, except for opening 38.

Opening 38 is then filled (step f) through dielectric deposition 42, to ensure the hermeticity of internal volume 40.

The final step (step g) provides openings 44, at the periphery of the volume 40 embracing the sensor 14, for accessing the contacts (not represented in the figure) for electrical connection to this sensor. Nota bene: in this embodiment the contacts are provided on the same face of substrate 12 as that integrating the sensor 14, in contrast to the embodiments illustrated in FIGS. 1-3 in which the contacts are on the opposite face.

FIG. 5 shows, in plane view, an example of a component 10 in accordance with the invention, stuck upon a support 46 such as a soft or flex circuit. This support 46 comprises connecting areas 48 connected to pads through interconnections 52 deposited onto the substrate. The pads 50 are located in the proximity, and in vis-à-vis, of the homologous contact pads 16 of circuit 10, to which they are connected using bonding wires 54. Thus, each contact pad 16 of the circuit is electrically connected to one of the areas 48, on which can be welded the tip of a microcable 56 for connection to a remote device.

One skilled in the art will appreciate that the present invention can be practiced by embodiment other than those disclosed herein, which are disclosed for purposes of illustration and not of limitation.

We claim:

1. A micro-fabricated biocompatible component implantable in a human body, comprising:
   an active element of the type selected from among the group consisting of a sensor for the measurement of a physiologic parameter, a micro-electromechanical system, and an integrated electronic circuit;
   a base substrate having a first face and a second face, said active element being integrated on said first face;
   metal pads that are biocompatible formed on said second face of said base substrate, said second face of said base substrate configured to be exposed to said body tissues or fluids when implanted in the human body;
   electrical connections integrated on the base substrate for connecting said metal pads to the active element;
   holes in the substrate for connecting said metal pads to said electrical connections in contact with said active element, said holes being hollowed through the base substrate and filled with a metal; and
   a lid made of silicon or quartz covering and peripherally enclosing said base substrate in a hermetic manner, said lid being a thin film layer deposited on the side of said first face of the base substrate integrating the active element, and having a raised portion such that the lid is separated from the active element to form a cavity, the cavity being free of any filler material;
   wherein said lid is formed on the base substrate according to a thin film packaging process; and
   wherein said base substrate and said lid form a biocompatible component capable of withstanding prolonged exposure to body tissues or fluids of the human body, and wherein the biocompatible component is essentially void of a metallic case for insulation between said active element and said body tissues or fluids, and void of insulating feedthroughs for electrical connection to the active element.

2. The implantable biocompatible component of claim 1, further comprising a biocompatible sealing material interposed between the first face of the base substrate and a face of the lid wherein the base substrate and the lid are welded by said biocompatible sealing material.

3. The implantable biocompatible component of claim 2, wherein the biocompatible sealing material further comprises a glass.

4. The implantable biocompatible component of claim 2, wherein the biocompatible sealing material further comprises one of a metal, a metallic alloy, gold, and palladium.

5. The implantable biocompatible component of claim 1, wherein the active element comprises radiofrequency (RF) circuits, and wherein at least one metal pad of said metal pads comprises a configuration and dimensions so as to form an antenna for transmitting RF signals.

6. The implantable biocompatible component of claim 5, wherein said RF circuits are remotely power-fed, and wherein at least one metal pad of said metal pads comprises a configuration and dimensions so as to form an antenna for receiving a remote power feed.

7. The implantable biocompatible active component of claim 1, wherein the active element comprises an accelerometer.

8. The implantable biocompatible active component of claim 7, wherein the accelerometer measures endocardial acceleration (EA) at a tip of a lead implanted in a patient's heart.

9. The implantable biocompatible component of claim 1, wherein the first face of said base substrate and a face of said lid are directly sealed to each other.

10. The implantable biocompatible component of claim 1, wherein said metal pads are coated with gold.

11. The implantable biocompatible component of claim 1, wherein the active element further comprises a remotely power-fed circuit.

12. The implantable biocompatible active component of claim 1, wherein the base substrate is made of boron-doped silicon.

13. The implantable biocompatible active component of claim 1, wherein the lid is made of boron-doped silicon.

14. The implantable biocompatible active component of claim 1, wherein the base substrate is made of silicon or quartz.

15. A method of manufacturing a hermetically sealed biocompatible component implantable in a human body, the method comprising:
   providing a base substrate having a first face and a second face;
   integrating on the first face of the base substrate an active element of the type selected from among the group consisting of a sensor for the measurement of a physiologic parameter, a micro-electromechanical system, and an integrated electronic circuit;
   forming hollow holes through the base substrate in the proximity to the active element;
   filling the holes with a metal;
   integrating electrical connections on the base substrate encompassing the active element and the metal filling the holes;
   depositing a sacrificial layer onto the first face of the base substrate encompassing the active element, the holes, and the electrical connections;
   depositing a top thin film layer made of silicon or quartz onto the sacrificial layer;
   removing the sacrificial layer such that the top thin film layer has a raised portion where the thin film layer is separated from the active element to form a cavity between the active element and the top layer, the cavity being free of any filler material after the sacrificial layer is removed; and
   forming metal pads on the second face of the base substrate encompassing the holes, wherein the metal pads are biocompatible, wherein the second face of the base substrate is configured to be exposed to the body tissues or fluids when implanted in the human body and wherein the biocompatible component is capable of withstanding prolonged exposure to body tissues or fluids of the human body.

16. The method of claim 15 further comprising:
   interposing a biocompatible sealing material between the first face of the base substrate and a face of the top layer; and
   welding the base substrate and the top layer with the biocompatible sealing material.

17. The method of claim 16, wherein the biocompatible sealing material comprises a glass.

18. The method of claim 16, wherein the biocompatible sealing material further comprises one of a metal, a metallic alloy, gold, and palladium.

19. The method of claim 15, wherein said metal pads are coated with gold.

20. The method of claim 15, wherein the base substrate is made of boron-doped silicon.

21. The method of claim 15, wherein the lid is made of boron-doped silicon.

22. The method of claim 15, wherein the base substrate is made of silicon or quartz.

* * * * *